United States Patent [19]
Cirri

[11] Patent Number: 5,272,412
[45] Date of Patent: Dec. 21, 1993

[54] METHOD FOR THE PRODUCTION OF EXTRACTION GRIDS FOR ION GENERATION AND GRIDS PRODUCED ACCORDING TO SAID METHOD

[75] Inventor: Gianfranco Cirri, Florence, Italy

[73] Assignee: Proel Tecnologie S.p.A., Florence, Italy

[21] Appl. No.: 20,754

[22] Filed: Jul. 28, 1992

[30] Foreign Application Priority Data

Jul. 31, 1991 [IT] Italy ................ FI/91/A194

[51] Int. Cl.⁵ .................... B32B 3/24; H01J 1/52
[52] U.S. Cl. .................... 313/360.1; 313/363.1; 313/348; 428/109; 428/256
[58] Field of Search ............ 428/109, 110, 256; 313/360.1, 363.1, 348

[56] References Cited

U.S. PATENT DOCUMENTS

3,971,964  7/1976  Slosiar .................... 313/355
5,110,384  1/1992  Dudek .................... 427/123

OTHER PUBLICATIONS

Kajiwara Kenichi; Ion Engine, Abstract vol. 012495, Sep. 1988.
Brouchous et al.; Review of Scientific Instruments, vol. 53, No. 8, Aug. 1982, New York US, pp. 1182-1184.
Nippon Telegraph and Telephone Corp.; Database WPIL, May 7, 1992 Abstract.

*Primary Examiner*—Alexander S. Thomas
*Attorney, Agent, or Firm*—McGlew and Tuttle

[57] ABSTRACT

An innovative method is proposed for the production of ion extraction grids, comprising the stages of:
disposing a plurality of wires or metallic filaments in a lattice structure;
coating said structure with a layer of boron.

The coating with boron may take place by thermal reduction of boron trichloride in a hydrogen atmosphere. This makes it possible to produce grids at low cost and with high resistance to sputtering, suitable for use for the extraction, focusing and acceleration of the beam in ion sources for industrial and space applications.

6 Claims, 2 Drawing Sheets

METHOD FOR THE PRODUCTION OF EXTRACTION GRIDS FOR ION GENERATION AND GRIDS PRODUCED ACCORDING TO SAID METHOD

FIELD OF THE INVENTION

The invention relates to a method for the production of grids for extracting, focusing and accelerating a beam of ions in an ion generation device, to a grid produced by said method and to an ion generation device incorporating said grid.

BACKGROUND OF THE INVENTION

Ion generation devices are very widely used in the industrial field for carrying out surface treatments (ion etching, cleaning, deposition of material, ion implantation, etc.) and chemical and physical analysis (for example, the determination of the type and orientation of crystals on the surface of a solid). In the space field, such devices are used as ion engines and, on earth, for the generation of simulated ionospheric plasma. An ion generation device is represented schematically in FIG. 1. It consists of an ionization chamber 1 and an extraction system 2. A substance in the form of a gas or vapor is introduced into the ionization chamber, and the (positive) ions of the desired chemical nature are obtained from the substance by various techniques which are known in themselves. These ions are then extracted from the ionization chamber, focused, and accelerated toward the objective of the extraction system 2.

Other parts may be present in the device, but will not be mentioned here since they are not relevant to the description of the invention which is the subject of the present patent application. However, it is appropriate to describe the extraction system 2 in greater detail. Said extraction system has the object of producing, at the outlet of the ionization chamber, a configuration of the electrical field (and in some cases of the magnetic field also) such as to accelerate the ions to the desired velocity and to focus the ion beam, according to the application. In addition, the extraction system must limit the flow of neutral atoms in order to improve the ionization efficiency, that is to optimize the outgoing ion flow with respect to the incoming neutral atom flow.

The configuration of the extraction system may or may not comprise one or more grids. The solution with a plurality of grids is most generally used and is necessary where there is a requirement for a high ionization efficiency and/or a high quality of the beam produced in terms of uniformity of energy of the ions and accuracy of focusing. Two or three grids are usually present, although devices with one and with four or more grids have also been produced. Of these grids, a certain number are maintained at strongly negative electrical potentials and have the purpose of accelerating the ions to form the beam and to prevent the exit of negative charges from the ionization chamber.

One of the most serious problems associated with a grid extraction system is that of sputtering, in other words the removal of material from the grids, and consequently their erosion, as a result of the bombardment of high-energy ions. This phenomenon becomes more marked as the energy of the incident ions increases, in other words as the electrical potential of the grids becomes more negative. The erosion of the grids necessitates, in the case of ion generators for industrial use, costly maintenance operations (inspection and periodic replacement of the grids and of the insulators on which the removed material is deposited) and also forms a source of impurities in the ion beam. In the case of ion engines for space applications, the phenomenon is clearly one of the most serious factors limiting their service life.

In the construction of grids, therefore, it is necessary to use material with a low sputtering coefficient, in other words those which suffer least from the erosion effect due to the incidence of high-energy ions.

At present, grids are constructed from sheets of materials such as steel, molybdenum, carbon or other material, of sufficient thickness to ensure the operability of the grid in the presence of erosion for the desired operating period. These sheets are cut to suitable sizes and must then be perforated according to a pattern which, in the larger models, requires thousands or tens of thousands of holes. The perforation is carried out by various techniques, but in all cases requires long periods and is generally very expensive, but above all produces relatively low values of transparency. Furthermore, the optical characteristics, in other words the ion beam focusing characteristics, of grids produced by this technique are not optimal.

SUMMARY AND OBJECTS OF THE INVENTION

The subject of the present invention is a different approach to the production of said grids to obtain a number of advantages over known techniques, as will be clearly understood by experts in the field from a reading of the following text.

Substantially, the method according to the invention specifies, for the production of extraction grids, the disposition of a plurality of metallic filaments in a lattice configuration, to form a grid structure, followed by the coating of the resulting structure with a layer of boron. The use of wires or metallic filaments imparts optimal mechanical characteristics as well as optimal characteristics of transparency and of focusing of the ion beam. The boron coating makes it possible to impart to the structure a very low coefficient of sputtering, since this material is extremely resistant to erosion caused by bombardment with high-energy ions.

Boron has not been used for the fabrication of grids up to the present time because of the known difficulties of working and welding it. These difficulties have been solved according to the invention by having the boron deposited by a pyrolytic method on an assembly of wires disposed according to the desired pattern for the grid. According to a preferred embodiment, the deposition of the boron is obtained by thermal reduction of boron trichloride in the presence of hydrogen. This deposition takes place on substrates having temperatures above 830° C., and is based on the following reaction:

$$2BCl_3 + 3H_2 \rightarrow 2B + 6HCl \qquad (I)$$

Advantageous embodiments of the method according to the invention are indicated in the attached claims. In particular, it is advantageous to dispose the metallic wires in two sets, the wires of each set being parallel to each other, and oriented differently with respect to the wires of the other set. The two sets are maintained at a certain distance, and the connection is made by welding with the boron deposited by a pyrolytic method on the structure defined by the wires.

Another subject of the invention is a grid produced by the method according to the invention. Advantageous embodiments of the grid according to the invention are indicated in the attached claims.

A further subject of the invention is an ion generation device comprising an ionization chamber and a system of accelerating grids comprising one or more grids produced according to the method of the present invention.

BRIEF DESCRIPTION OF THE DRAWINGS

The invention will be more clearly understood by examining the description and the attached drawing, which shows a practical, non-restrictive embodiment of the invention. In the drawing.

DETAILED DESCRIPTION OF THE PREFERRED EMBODIMENT

Figure 1:
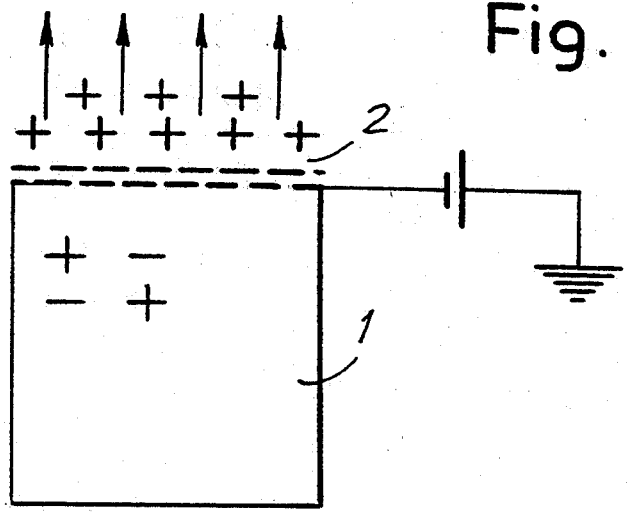
FIG. 1 is a diagram of an ion generator, briefly described previously.
Figure 2:
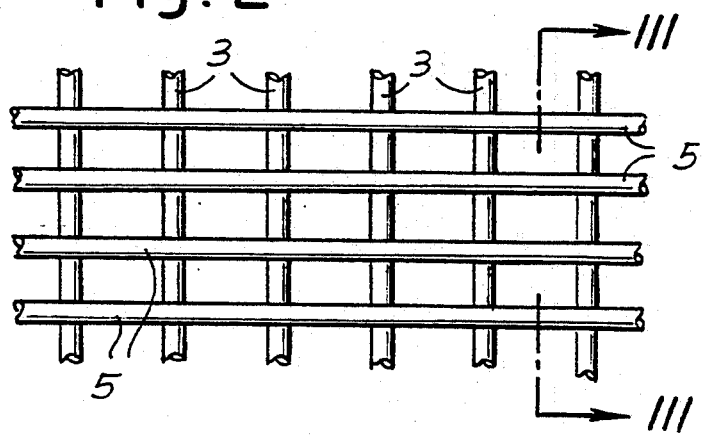
FIG. 2 is a plan view of a portion of a lattice produced with the wires according to the invention.
Figure 3:
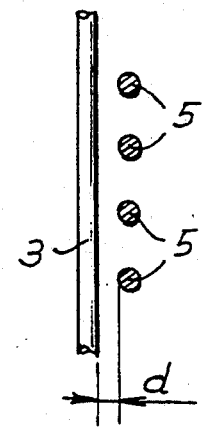
FIG. 3 is a detail section through III—III in FIG. 2.

For the production of an extraction grid, a lattice structure is first produced, and is formed by two sets of metal, in particular molybdenum or tungsten, wires or filaments, disposed as illustrated in FIGS. 2 and 3. More particularly, a first set of wires 3 parallel to each other is provided, together with a second set of wires 5 disposed with an orientation of 90° with respect to the wires 3, and parallel to each other. The wires 3 and 5 are spaced apart by an amount d, and are connected to form the grid by means of the boron which will be deposited on their surfaces according to the technique described below.

Figure 6:
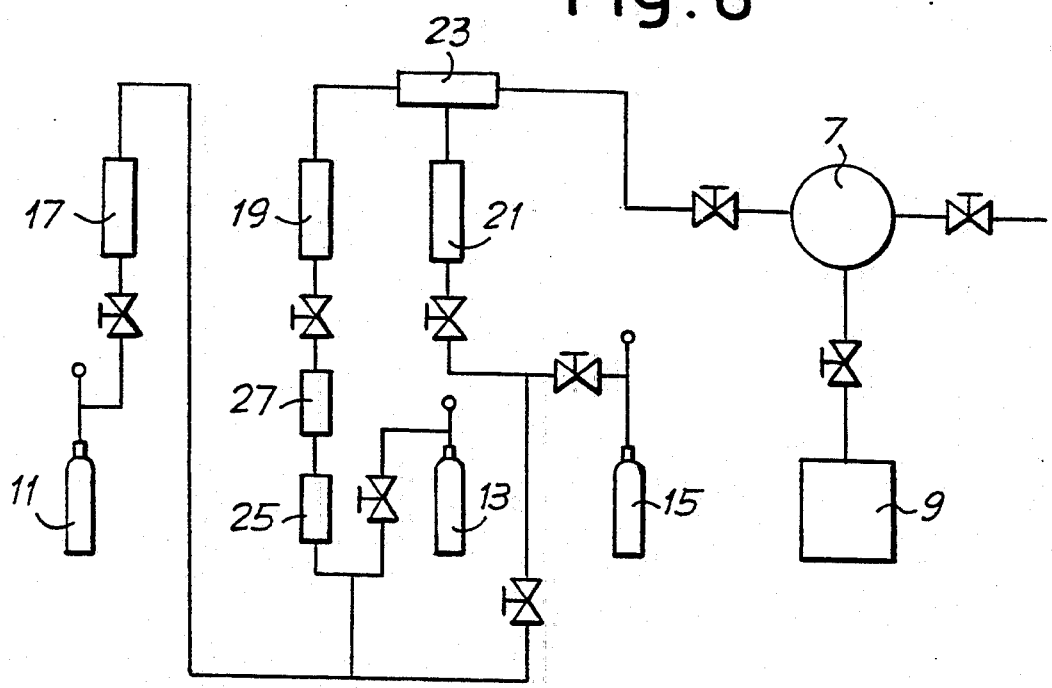
FIG. 6 is a schematic diagram of equipment for performing the deposition of boron by a pyrolytic method on the filaments of the grid.

This disposition of wires is introduced into a high-vacuum chamber 7 of an installation of the type schematically shown in FIG. 6. The wires prepared in this way are connected to electrical contacts, in such a way that it is possible to make an electrical current flow through the wires to heat them by the Joule effect, in order to perform the deposition by a pyrolytic method of the boron on the surfaces of the wires.

The installation in FIG. 6 comprises, in addition to the high-vacuum chamber 7, a vacuum pump 9, an inert gas container 11, a hydrogen container 13, and a container 15 for the boron trichloride. The three containers 11, 13 and 15 are connected by flow passages to the chamber 7 with the interposition of flowmeters 17, 19 and 21 and a mixing chamber 23. A means 25 for the removal of oxygen and a means 27 for the elimination of moisture are also provided in the hydrogen supply line from the reservoir 13.

The process for the deposition of the boron on the structure formed by the wires 3 and 5 is as follows. The chamber 7 is initially evacuated by means of the high-vacuum pump 9, and is then flushed with the inert gas, for example argon, contained in the reservoir 11. After the flushing, hydrogen is introduced into the chamber 7, and the wires are heated by the Joule effect, by making a suitable electrical current pass through them, to a temperature of 930° C. for example. Finally, the boron trichloride is passed into the chamber 7 and the temperature of the wires is kept constant during the period of build-up of boron on their surfaces. The pyrolytic deposition takes place by means of the thermal reduction of the boron trichloride in the presence of hydrogen according to formula (I) shown above.

Figure 4:
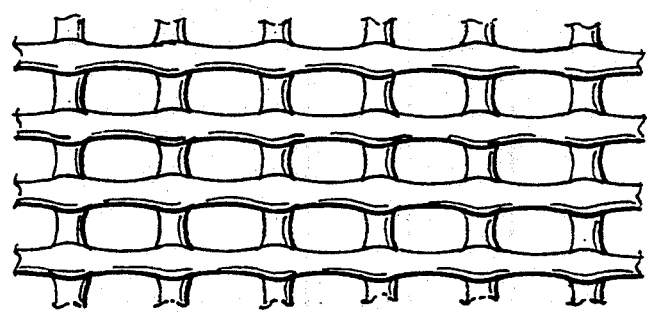
FIG. 4 is a plan view of the grid after the deposition of boron.
Figure 5:
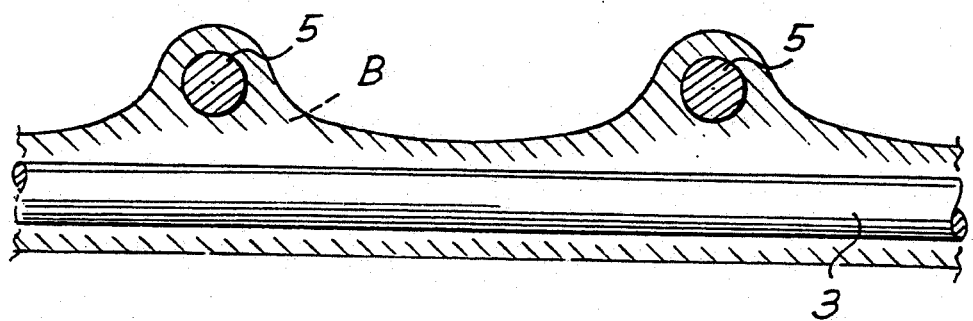
FIG. 5 is an enlargement of the junction region of two wires after the deposition of the boron.

The build-up of the boron is substantially uniform along the surface of the wires, with the exception of the regions where wires 3 and 5 cross. This is because in this region the temperature is higher as a result of the radiation, and there is consequently a greater deposition of boron and a welding of the wires 3 to the wires 5. FIG. 4 shows schematically a plan view of the grid structure which is obtained after the deposition of the boron B on the surfaces of the wires 3 and 5, while FIG. 5 shows a schematic enlargement in which the greater thickness of the boron B at the crossings of wires 3 and 5 may be seen. The build-up of boron on the surfaces of the wires forming the structure of the grid may be monitored by positioning an auxiliary wire at a certain precise distance from one of the wires of the structure. This auxiliary wire may be formed by one of the wires 3 or 5, which is suitably interrupted at a predetermined point. The build-up of boron is monitored by measuring the resistance between the auxiliary wire and the wire of the grid to which it is parallel. The resistance varies as a function of the thickness of boron between the two wires.

At the end of the deposition, the auxiliary wire is connected by a boron link to the structure formed by the boron-coated wires 3 and 5. The auxiliary wire may thus be used to measure the temperature of the grid during the operation of the ion generator in which the grid is included. This is because the system formed by the auxiliary wire and by the wires of the structure to which it is connected by the boron link constitutes a thermistor whose resistance is a function of the grid temperature. Consequently, by measuring the resistance between the auxiliary wire and the grid structure it is possible to monitor the grid temperature during operation.

The principal advantages of the grid produced by the technique according to the present invention by comparison with known grids are of a technological and economic nature, and in summary are as follows:

a) The low coefficient of sputtering of the boron and its high melting point (=2200° C.) provide a longer life of the grids, a lower deposition of removed material onto the parts surrounding the grid (particularly damaging on the insulators) and a greater purity of the ion beam. Consequently, the maintenance costs of ion generators for industrial use may be significantly reduced while better operating characteristics are obtained. The advantage is still more evident in the case of the space application of these devices, making it possible to lengthen their service life.

b) The grid perforation operation is eliminated. The method according to the invention permits the manufacture in a single batch of a whole grid (or a number of grids) from low-cost materials ($BCl_3$, $H_2$) and with high boron deposition rates.

c) The possibility of monitoring the temperature of the grid during its operation is provided automatically, by means of the auxiliary wire and the boron link which connects it to the rest of the grid structure.

It is to be understood that the drawings show only one embodiment provided solely as a practical demonstration of the invention, it being possible for this invention to be varied in its forms and dispositions without thereby departing from the scope of the guiding concept of the invention.

I claim:

1. An ion generator comprising:

an ionization chamber; and means for extracting and focusing ions from said chamber, said means for extracting and focusing comprising one or more grids having a structure formed of a plurality of metallic wires disposed in a lattice and coated with boron.

2. The ion generator according to claim 1, wherein: said metallic wires are disposed in two alignments each with a different orientation, wires of each alignment being parallel to each other.

3. The ion generator according to claim 2, wherein: said alignments are perpendicular to each other.

4. The ion generator according to claim 2, wherein: said wires of one alignment are spaced apart form said wires of another alignment, said wires of one alignment being connected to wires of said other alignment by a weld formed by said coated boron.

5. The ion generator according to claim 1, further comprising:

an auxiliary wire parallel to one of the wires of said grid, a boron link being disposed between said grid and said auxiliary wire.

6. The ion generator according to claim 5, wherein: said auxiliary wire is formed by one of the wires of said grid structure.

* * * * *